US007973358B2

(12) United States Patent
Hanke et al.

(10) Patent No.: US 7,973,358 B2

(45) Date of Patent: Jul. 5, 2011

(54) COUPLER STRUCTURE

(75) Inventors: Andre Hanke, Unterhaching (DE); Oliver Nagy, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 361 days.

(21) Appl. No.: 12/187,406

(22) Filed: Aug. 7, 2008

(65) Prior Publication Data

US 2010/0033273 A1 Feb. 11, 2010

(51) Int. Cl.
*H01L 21/00* (2006.01)

(52) U.S. Cl. ................ 257/335; 257/355; 257/E21.345; 257/E21.586; 257/E29.033; 257/E33.003

(58) Field of Classification Search .......... 257/335–365, 257/E21.345, 586, 686, 29.033, 29.037, 33.003, 257/33.005

See application file for complete search history.

(56) References Cited

U.S. PATENT DOCUMENTS

| | | | | |
|---|---|---|---|---|
| 4,075,581 | A * | 2/1978 | Davidson et al. | 333/116 |
| 5,073,761 | A * | 12/1991 | Waterman et al. | 333/24 C |
| 6,661,386 | B1 * | 12/2003 | Petros et al. | 343/713 |
| 6,906,598 | B2 * | 6/2005 | Roberson et al. | 333/24 R |
| 7,741,929 | B2 * | 6/2010 | Hash | 333/116 |
| 2007/0132029 | A1 * | 6/2007 | Mitra et al. | 257/355 |

* cited by examiner

*Primary Examiner* — Michael S Lebentritt

(74) *Attorney, Agent, or Firm* — Infineon Techn. AG; Philip H. Schlazer

(57) ABSTRACT

One or more embodiments relate to a semiconductor device, comprising: a substrate; and a radio frequency coupler including a first coupling element and a second coupling element spacedly disposed from the first coupling element, the first coupling element including at least one through-substrate via disposed in the substrate, the second coupling element including at least one through-substrate via disposed in the substrate.

36 Claims, 5 Drawing Sheets

COUPLER STRUCTURE

FIELD OF THE INVENTION

Generally, the present invention relates to semiconductor devices and methods of making semiconductor devices. More particularly, the present invention relates to semiconductor devices comprising radio frequency couplers.

BACKGROUND OF THE INVENTION

In the domain of ultra high frequency and radio frequency (RF) circuitry, it is often desirable to generate one or more attenuated RF signals in secondary couplings from a common RF signal received by a primary coupling element.

As an example, an RF coupler may be a passive device. It may be used to control the amplitude and direction of radio frequency signals in a transmission path between circuit modules. An RF coupler may, for example, be configured as a stripline coupler, a microstrip coupler or the like. A stripline coupler may comprise two parallel strips of metal on a printed circuit board. A stripline coupler ordinarily functions as an RF signal attenuator, that is, a device for generating a controlled amount of signal power transfer from one transmission path to another to provide one or more reduced amplitude RF signals.

SUMMARY OF THE INVENTION

One or more embodiments relate to a semiconductor device, comprising: a substrate; and a radio frequency coupler including a first coupling element and a second coupling element spacedly disposed from the first coupling element, the first coupling element including at least one through-substrate via disposed in the substrate, the second coupling element including at least one through-substrate via disposed in the substrate. A through-substrate via is a conductive via passing through the substrate.

One or more embodiments relate to a radio frequency coupler, comprising: a first coupling element, the first coupling element comprising at least one through-substrate via disposed in a semiconductor substrate; and a second coupling element spacedly disposed from the first coupling element, the second coupling element comprising at least one through-substrate via disposed in the semiconductor substrate.

One or more embodiments relate to a semiconductor device, comprising: a substrate; and a radio frequency coupler including a first coupling element and a second coupling element electromagnetically coupled to the first coupling element, the first coupling element including at least one conductive via passing through the substrate, the secondary coupling element including at least one conductive via passing through the substrate.

One or more embodiments relate to a radio frequency coupler, comprising: a first coupling element, the first coupling element comprising at least one conductive via passing through a semiconductor substrate; and a second coupling element electromagnetic coupled to the first coupling element, the second coupling element comprising at least one conductive via passing through the semiconductor substrate.

One or more embodiments relate to a semiconductor device, comprising: a substrate; and a radio frequency coupler, the coupler comprising at least one through-substrate via disposed through the substrate.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1A:
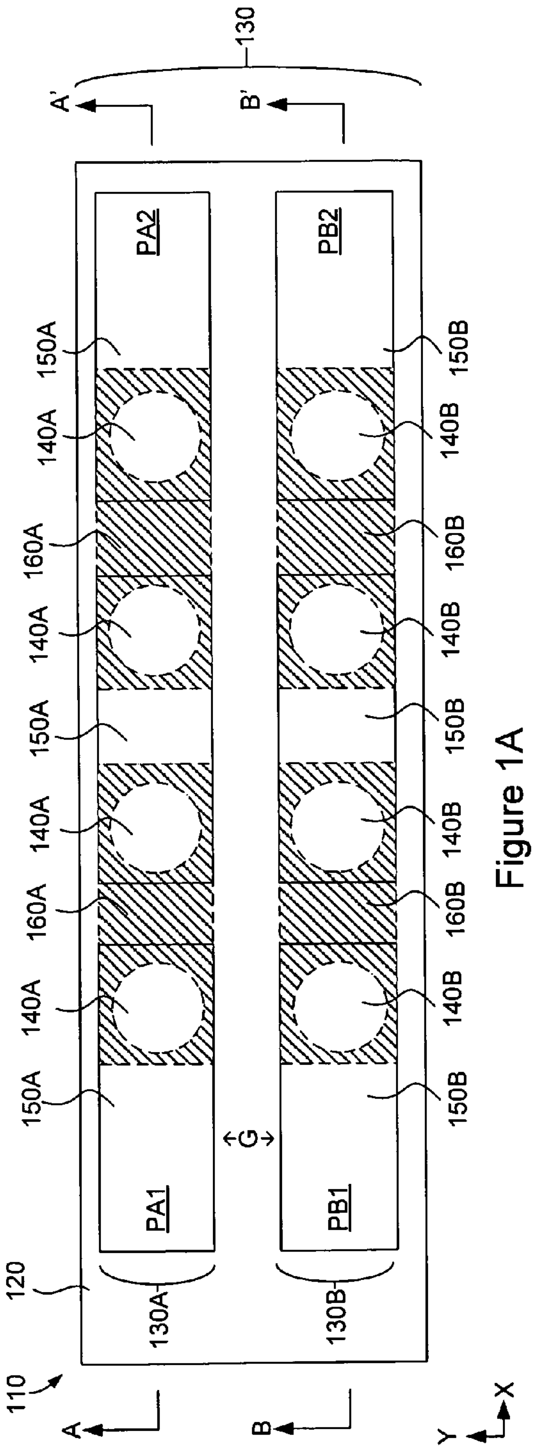
FIG. 1A shows a top view of a radio frequency coupler in accordance with an embodiment of the present invention.
Figure 1B:
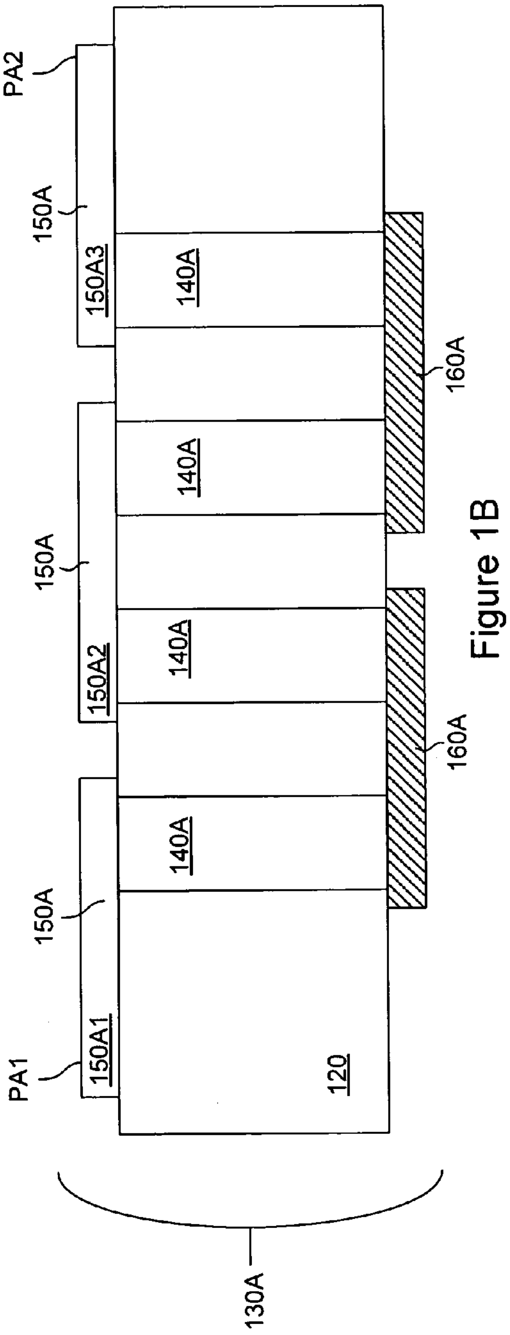
FIG. 1B is a cross sectional view of the embodiment shown in FIG. 1A.
Figure 1C:
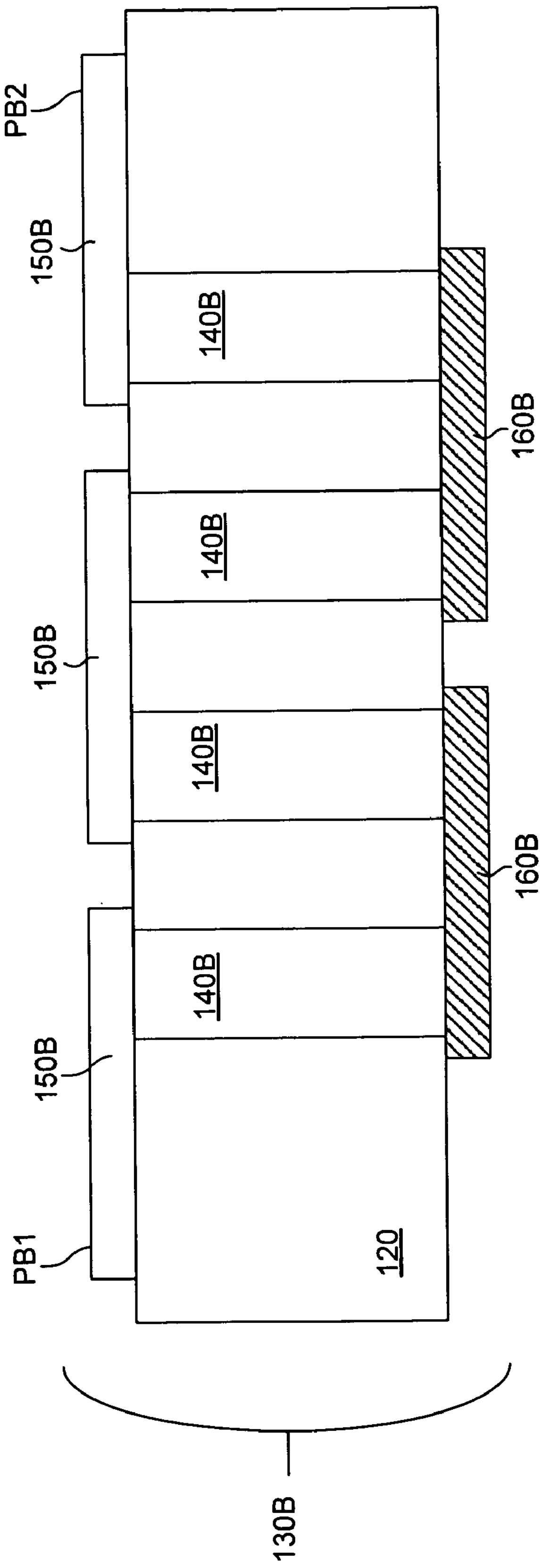
FIG. 1C is a cross sectional view of the embodiment shown in FIG. 1A.

FIGS. 1A,B,C shows a semiconductor device 110 which is an embodiment of the present invention. FIG. 1A shows a top view of the device 110. FIG. 1B shows a cross sectional view through the cross section AA'. FIG. 1C shows a cross sectional view through the cross section BB'.

The semiconductor device 110 comprises a substrate 120. The substrate 120 may be any type of substrate. In an embodiment, the substrate 120 may be a p-type substrate. However, more generally, in one or more embodiments of the invention, the substrate may be a silicon substrate or other suitable substrate. The substrate may be a bulk mono-crystalline silicon substrate (or a layer grown thereon or otherwise formed therein), a layer of (110) silicon on a (100) silicon wafer, a silicon-on-insulator (SOI) substrate. The SOI substrate may, for example, be formed by a SIMOX process. The substrate may be a silicon-on-sapphire (SOS) substrate. The substrate may be a germanium-on-insulator (GeOI) substrate. The substrate may include one or more materials such as semiconductor materials such as silicon germanium, germanium, germanium arsenide, indium arsenide, indium arsenide, indium gallium arsenide, or indium antimonide. In one or more embodiments, the substrate 120 may comprise a non-conductor. In one or more embodiments, the substrate 120 may comprise a semiconductor. In one or more embodiments, the substrate 120 may comprise a dielectric.

The semiconductor device 110 further comprises a radio frequency (RF) coupler 130. The RF coupler 130 comprises a first RF coupling element 130A and a second RF coupling element 130B. In one or more embodiments, the first RF coupling element may be spacedly disposed from the second RF coupling element 130B. In one or more embodiments, the first coupling element 130A may be electromagnetically coupled to the second coupling element 130B. A radio frequency signal applied to the first coupling element may be coupled to the second coupling element.

In one or more embodiments, the first RF coupling element 130A may be electrically insulated from the second RF coupling element 130B so that electrical current does not flow between them. In one or more embodiments, the first and second coupling elements may each be electrically coupled to a ground.

In the embodiment shown in FIGS. 1A and 1B, the first RF coupling element 130A comprises three upper conductive elements 150A, four through-substrate vias 140A and two lower conductive elements 160A. Each of the through-substrate vias 140A is a conductive via passing through the substrate 120. It is noted that, when the substrate comprises a silicon material, the through-substrate via may also be referred to as a through-silicon via. The through-substrate vias 140A of the first RF coupling element 130A may be referred to as first through-substrate vias.

In one or more embodiments, the first RF coupling element 130A may include at least one upper conductive element 150A. In one or more embodiments, the first RF coupling element 130A may include at least one through-substrate via 140A. In one or more embodiments, the first RF coupling element 130A may include at least one bottom conductive element 160A.

In one or more embodiments, the first RF coupling element 130A may include a plurality of upper conductive elements 150A. In one or more embodiments, the first RF coupling element 130A may include a plurality of through-substrate vias 140A. The plurality of through-substrate vias 140A may be spacedly disposed from each other. The plurality of through-substrate vias 140A may be electrically coupled together. In one or more embodiments, the first RF coupling element 130A may include a plurality of bottom conductive elements 160A.

In the embodiment shown in FIGS. 1A and 1C, the second RF coupling element 130B comprises three upper conductive elements 150B, four through-substrate vias 140B and two lower conductive elements 160B. Each of the through-substrate vias 140B is a conductive via passing through the substrate 120. It is noted that, when the substrate comprises a silicon material, the through-substrate via may also be referred to as a through-silicon via. The through-substrate vias 140B of the second RF coupling element 130B may be referred to as second through-substrate vias.

In one or more embodiments, the second RF coupling element 130B may include at least one upper conductive element 150B. In one or more embodiments, the second RF coupling element 130B may include at least one through-substrate via 140B. In one or more embodiments, the second RF coupling element 130B may include at least one bottom conductive element 160B.

In one or more embodiments, the second RF coupling element 130B may include a plurality of upper conductive elements 150B. In one or more embodiments, the second RF coupling element 130B may include a plurality of through-substrate vias 140B. The plurality of through-substrate vias 140B may be spacedly disposed from each other. The plurality of through-substrate vias may be electrically coupled together. In one or more embodiments, the second RF coupling element 130B may include a plurality of bottom conductive elements 160B.

In the embodiment shown in FIGS. 1A,B,C, each of the through-substrate vias 140A,B has a top end and a bottom end. The top end is proximate to the top side of the substrate 120 and distant from the bottom side. The bottom end is proximate to the bottom side of the substrate 120 and distant from the top side.

The top end of each of the through-substrate vias 140A,B may be electrically coupled to an upper conductive element 150A,B, respectively. The bottom end of each of the through-substrate vias 140A,B may be electrically coupled to a lower conductive element 160A,B, respectively.

In one or more embodiments (as, for example, shown in FIG. 1B) the through-substrate vias 140A may be electrically coupled end-to-end in a series arrangement between the ports PA1 and PA2. For example, the bottom end of a first one of the vias 140A may be coupled to the bottom end of a second one of the vias. The top end of the second one of the vias may be coupled to the top end of a third one of the vias. The bottom end of a third one of the vias may be coupled to a bottom end of a fourth one of the vias, and so forth.

Likewise, in one or more embodiments, (as, for example shown in FIG. 1C) the through-substrate vias 140B may be electrically coupled in a series arrangement between the ports PB1 and PB2.

Each of the through-substrate vias, the upper conductive elements and the lower conductive elements may be formed of any conductive material. In one or more embodiments, the conductive material may be a metallic material. In one or more embodiments, the metallic material may be a pure metal or a metal alloy. In one or more embodiments, the metallic material may include one or more of the elements Al (the element aluminum), Cu (the element copper), Co (the element cobalt), W (the element tungsten), Ag (the element silver), Au (the element gold), Ti (the element titanium), and Ta (the element tantalum). Examples of metallic materials include pure aluminum, aluminum alloy, pure copper, copper alloy, pure cobalt, cobalt alloy, pure tungsten, tungsten alloy, pure silver, silver alloy, pure gold, gold alloy, pure titanium, titanium alloy, pure tantalum and tantalum alloy. Combinations of materials may also be used. In one or more embodiments, the conductive material may comprise a silicon material. In one or more embodiments, the silicon material may be a polysilicon such as a doped polysilicon. In one or more embodiments, the conductive material may be a monocrystalline silicon material such as a doped monocrystalline silicon. The doping may, for example, be n-type doped or p-type doped. The through-substrate vias, the upper conductive elements and the lower conductive elements may comprise the same or different materials.

Conductive non-metallic materials may also be used such as graphite, conductive polymers, conductive plastics, etc. Different materials may be used for the upper conductive elements, lower conductive elements and through-substrate vias.

In the embodiment shown in FIGS. 1A,B,C, the first RF coupling element 130A includes a first port PA1 and a second port PA2. Likewise, the second RF coupling element 130B includes a first port PB1 and a second port PB2.

Figure 2:
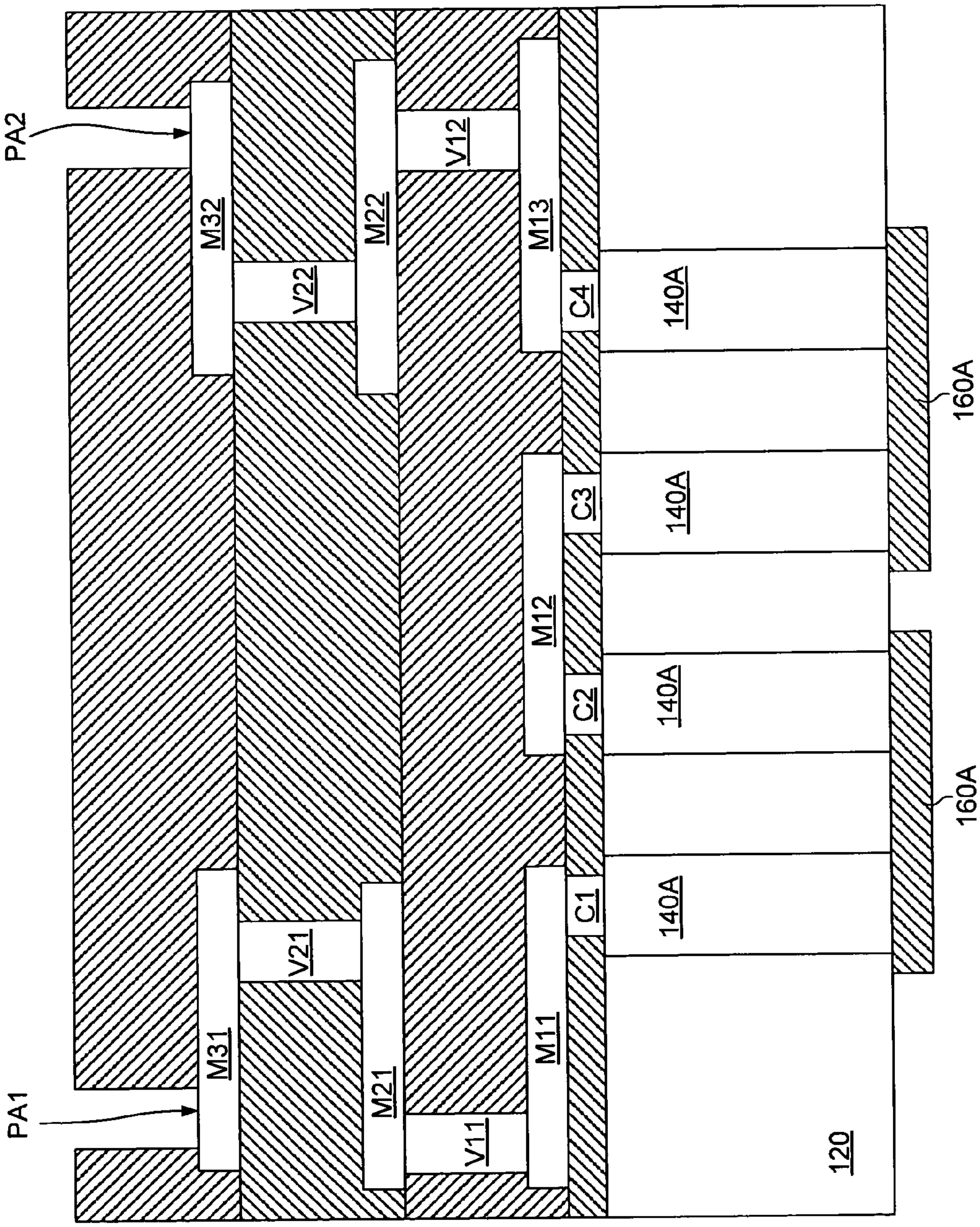
FIG. 2 is a cross sectional view of a radio frequency coupler in accordance with an embodiment of the present invention.

The upper conductive elements 150A,B may be formed in different ways. An example of forming the upper conductive elements 150A of the first RF coupling element 130A from FIG. 1B is shown in FIG. 2. The same idea may be applied to the upper conductive elements 150B.

In the embodiment shown in FIG. 1B, there are three upper conductive elements 150A. These are 150A1, 150A2 and 150A3. In the embodiment shown in FIG. 2, it seen that the upper conductive element 150A1 comprises a conductive contact C1, a conductive line M11 (from the first metallization level M1), a conductive via V11, a conductive line M21 (from the second metallization level M2), a conductive via V21 and a conductive line M31 (from the third or final metallization level M3).

Still referring to FIG. 2, it is seen that the upper conductive element 150A2 (shown in FIG. 1B) comprises a conductive contact C2, a conductive line M12 (from the first metallization level M1) and a conductive contact C3.

Still referring to FIG. 2, it seen that the upper conductive element 150A3 (shown in FIG. 1B) comprises a conductive contact C4, a conductive line M13 (from the first metallization level M1), a conductive via V12, a conductive line M22

(from the second metallization level M2), a conductive via V22 and a conductive line M32 (from the third or final metallization level M3).

It is noted that the contacts C1, C2, C3, and C4 electrically couple the through-substrate vias to the conductive lines of the first metallization level. However, the conductive vias V11, V12, V21, and V22 electrically couple a conductive line of one metallization level to a conductive line of another metallization level. It is noted that the conductive vias V11, V12, V21 and V22 may also pass through an interlevel dielectric layer between one of the metallization level to another metallization level. These conductive vias may also be referred to as conductive ILD vias. In one or more embodiments, the conductive lines may be metal lines. The metal lines may comprise, for example, a pure metal or a metal alloy. Examples of metals include, but not limited to, pure aluminum, aluminum alloy, pure copper, and copper alloy. The conductive lines may also, for example, comprise a polysilicon material such as a doped polysilicon.

More generally, each of the upper conductive elements may comprise at least one conductive contact. Likewise, each of the upper conductive elements may comprise at least one conductive line (from at least one metallization level). Likewise, each of the upper conductive elements may comprise at least one conductive via (such as, for example, a conductive ILD via) electrically coupled a conductive line from one metallization level to a conductive line of another metallization level.

In one or more embodiments, it is also possible that an upper conductive element include a conductive trace or connection from a redistribution layer. It is also possible that an upper conductive element also include a wafer ball of a wafer level design package.

One or more of the lower conductive elements 160A,B may, for example, comprise one or more portions of a conductive layer formed on the back side of the substrate (possibly in a back end process). As noted, generally, each of the lower conductive elements 160A,B may be formed of any conductive material.

Referring to FIG. 1A, it is seen that the through-substrate vias 140A are aligned with the through-silicon vias 140B in the Y-direction. However, this does not have to be the case. In another embodiment, the through-substrate vias 140A may be staggered with respect to the through-substrate vias 140B. Likewise, some may be aligned and some may be staggered.

Referring to FIG. 1A, in one or more embodiments, the first coupling element 130A may be a primary coupling element. Likewise, in one or more embodiments, the second coupling element 130B may be a secondary coupling element. The primary coupling element 130A may, for example, be used for receiving an RF signal at the port PA1. Hence, in one or more embodiment, the port PA1 may be an input port. Likewise, in one or more embodiments, the port PA2 may be an output port. A gap "G" is provided between the primary coupling element 130A which receives the RF input signal and a secondary coupling element 130B. The RF signal on the primary coupling element 130A may be electromagnetically coupled to the secondary coupling element 130B for generating a second RF signal having certain desired characteristics. For example, frequency selectivity may be useful aspect in the design of radio frequency (RF) circuits. Thus, secondary coupling element 130B could provide an attenuated RF signal from the input RF signal. Such an RF circuit may, for example, be used to reject a particular RF frequency if desired. In one or more embodiments, the port PA2 may be electrically coupled to ground.

Secondary coupling 130B has a first port PB1 and a second port PB2. In one or more embodiment, the second port PB2 may be an output port for transmission of the generated RF signal. In one or more embodiments, the output port PB2 may be provided to be substantially orthogonal to the plane of the coupling surface so as to prevent a wave from being reflected back to pass through in the opposite direction. In one or more embodiments, the port PB2 may be electrically coupled to ground. In one or more embodiments, the port PB1 may be electrically coupled to ground.

In one or more embodiments, the RF coupled 130 may be configured as a directional coupler.

In the embodiment shown in FIGS. 1A,B,C, the primary coupling element 130A runs substantially parallel with the secondary coupling element 130B. The electromagnetic coupling may thus run along the entire length of the RF coupler.

The dimensions and configurations of the primary and secondary coupling elements may be changed to vary the electromagnetic coupling between the coupling elements. Small changes in the dimensions and configurations of the coupling elements may be become important since, in the case of an RF circuit, circuit dimensions may be comparable with the wave length of the signal to be attenuated. In one or more embodiments, the total length of the primary coupling elements may be about one-quarter wavelength. In one or more embodiments, the total length of the secondary coupling elements may about one-quarter wavelength.

In an RF coupler, the coupling characteristics may be determined by one or more factors such as the gap G between the primary and secondary coupling elements, the width of each element, and the distance or length along which the longitudinal axis of the secondary element is coextensive with the longitudinal or coupling axis of the primary coupling. The coupling characteristic may also be determined by the material between the primary and secondary coupling elements. The gap G dimension may determine, for example, the amount of coupling that will occur between the coupling elements. The width of the coupling elements may at least partially define the impedance matching characteristics of the RF coupler and the coextensive length of the primary and secondary coupling elements may at least partially affect the amount of coupling that will occur and the directionality of the elements. The coupling characteristics between the primary and secondary coupling elements may also be affected by the substrate material between the coupling elements. In addition, it is possible that additional materials may be placed between the primary and secondary couplers. These additional materials may comprise non-conductors, semiconductors and/or dielectrics.

Referring to FIG. 1A, in one or more embodiments, an RF coupler 130 may include a primary coupling element 130A for receiving an RF input at an input port PA1. Primary coupling element 130A defines an RF coupling axis along its entire length. Primary coupling element 130A also has an output port P1B for unidirectional transmission of the RF signal. A secondary coupling element 130B is provided which may be in parallel to the RF coupling axis of the primary coupling element 130A. The RF signal from primary coupling element 130A may be electromagnetically coupled to secondary coupling element 130B across a coupling interface or gap G. It is noted that in another embodiment of the invention, the distance G may vary along the length of the primary and secondary coupling elements.

In one or more embodiments, the RF coupler may be adapted to use for coupling a portion of an RF signal passing through the primary RF coupling element (such as first RF coupling element 130A to a secondary RF coupling element (such as second RF coupling element 130B) such that the RF signal on the secondary RF coupling element is output in the opposite direction from the output end of the primary coupling element.

In one or more embodiments, the RF coupler may be adapted to use as an attenuator for reducing the amplitude of an input RF signal on the primary coupling element (such as primary coupling element 130A) and producing an output RF signal with a selected reduced amplitude on the secondary RF coupling element (such as secondary coupling element 130B).

In an embodiment, one or more of the ports or ends of the first and/or second coupling elements 130A,B may be provided with a ground lead which provides a conductive path to ground (optionally through a resistor). An internal ground may be useful in preventing cross interference and in eliminating parasitic capacitance.

Figure 3:
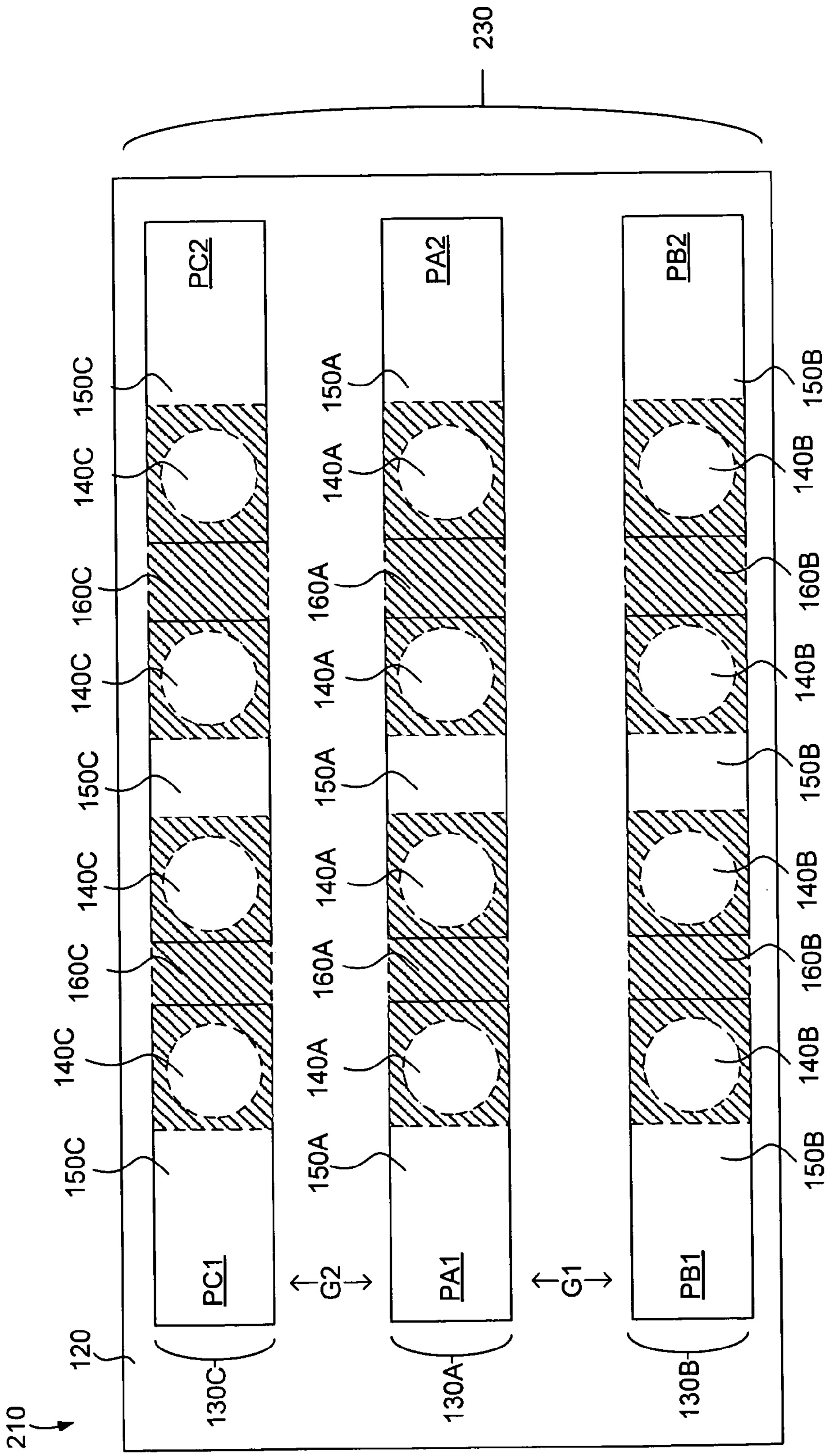
FIG. 3 is a top view of a radio frequency coupler in accordance with an embodiment of the present invention.

In one or more embodiments, an RF coupler may comprise three or more coupling elements. In one or more embodiments, the three or more coupling elements may be spacedly disposed from each other. FIG. 3 shows a semiconductor device 220 which is an embodiment of the present invention. The semiconductor device comprises a radio frequency coupler 230. In the embodiment shown in FIG. 3, the RF coupler 230 comprises a first coupling element 130A, a second coupling element 130B and a third coupling element 130C. In one or more embodiments, the first coupling element 130A may be used as a primary coupling element 130A. The second coupling element 130B may be used as a first secondary coupling element 130B. Likewise, the third coupling element 130C may be used as a second secondary coupling element 130C. In the RF coupler 230 shown in FIG. 3, there is a first gap G1 between the first coupling element 130A and the second coupling element 130B. Likewise, there is a second gap G2 between the first coupling element 130A and the third coupling element 130C. The gap G1 may stay the same or may vary along the length of RF coupler. Likewise, the gap G2 may stay the same or may vary along the length of the RF coupler.

With regards to the RF coupler 230 shown in FIG. 3, in one or more embodiments, there may be electromagnetic coupling between the primary coupling element 130A and the first secondary coupling element 130B. Likewise, in one or more embodiments, there may be electromagnetic coupling between the primary coupling element 130A and the second secondary coupling element 130C. In one or more embodiments, there may be electromagnetic coupling between the first secondary coupling element and the second secondary coupling element.

The first secondary coupling element 130B may run substantially in parallel to the primary coupling element 130A. Likewise, the second secondary coupling element 130C may run substantially in parallel to the primary coupling element 130A. In one or more embodiments, the port ends of the secondary coupling elements 130B and 130C may be orthogonal to the respective surfaces of the secondary coupling elements.

Referring to FIG. 3, in one or more embodiments, an RF coupler 230 includes a first coupling element 130A which may be a primary coupling element receiving an RF input at port PA1. Primary coupling element 130A may define an RF coupling axis along its entire length. Primary coupling element 130A may also have an output end PA2 for unidirectional transmission of the RF signal. The second RF coupling element 130B may define a first secondary coupling element which is in parallel relation to the RF coupling axis of the primary coupling element 130A. The RF signal from the primary coupling element 130A may be electromagnetically coupled to coupling element 130B across a coupling interface or gap G1. The second RF coupling element 130B has a first port PB1 and a second portion PB2. A third RF coupling element 130C may define a second secondary coupling element which may be disposed in parallel relation on a respective opposite side of the primary coupling element 130A. The third RF coupling element 130C may have a first port PC1 and a second port PC2. The RF signal from primary coupling element 130A may also be electromagnetically coupled to coupling element 130C across a coupling interface or gap G2. It is possible that there is some electromagnetic coupling between the second coupling element 130B and the third coupling element 130C.

In another embodiment of the invention, a dielectric layer may be disposed about the sidewall surface of the through-substrate via. The dielectric layer may serve to electrically isolate the through-silicon via from the substrate. It may also be used to modify the electromagnetic coupling between the coupling elements. An example is shown in FIG. 4 which shows the cross section from FIG. 2 except that a dielectric layer 144 laterally surrounds each of the vias 140A.

In one or more embodiments, the substrate-through vias may be formed by first forming via openings through only a portion of a substrate. In a subsequent processing step, a conductive material may be formed within the via openings. In a subsequent processing step, the bottom side of the substrate may be thinned (possibly by a mechanical grinding step) so that the conductive material is exposed.

Figure 4:
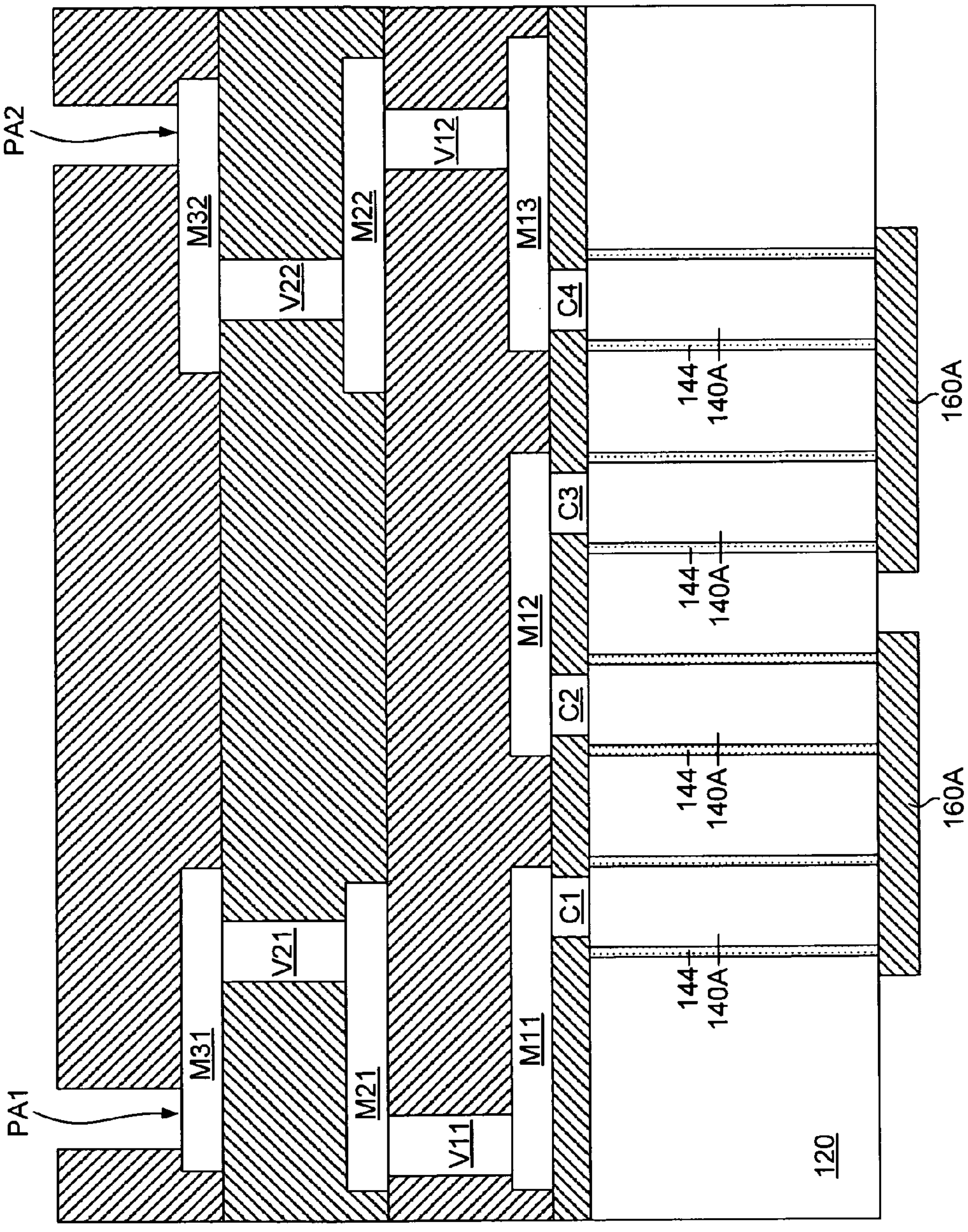
FIG. 4 is a cross section view of a radio frequency coupler in accordance with an embodiment of the present invention.

In the case in which a dielectric layer is disposed about the sidewall surface of the substrate-through via (such as shown in FIG. 4), the substrate-through vias may be formed by first forming via openings through only a portion of a substrate. In a subsequent processing step, a dielectric material may be formed within the via opening so as to line the opening. In one or more embodiments, the dielectric material may be deposited by a conformal deposition. In a subsequent processing step, a conductive material may be formed within the via openings. In one or more embodiments, the conductive material may be formed using a conformal deposition. In a subsequent processing step, the bottom side of the substrate may be thinned so that the conductive material is exposed.

The substrate-through via may be formed to have many different types of shapes. For example, in one or more embodiments, the substrate-through via may be in the form of a conductive plug. In other embodiments, the substrate-through via may be in the form of a conductive spacer or conductive liner which lines the sidewall surface of an opening. A conductive liner or a conductive spacer may be formed by a conformal deposition of a conductive material.

The disclosure herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor device, comprising:

a substrate; and a radio frequency coupler including a first coupling element and a second coupling element spacedly disposed from said first coupling element, said first coupling element including at least one through-substrate via disposed in said substrate, said second coupling element including at least one through-substrate via disposed in said substrate.

2. The device of claim 1, wherein said first coupling element is electromagnetically coupled to said second coupling element.

3. The device of claim 1, wherein said at least one through-substrate via of said first coupling element is a plurality of electrically coupled through-substrate vias and said at least one through-substrate via of said second coupling element is a plurality of electrically coupled through-substrate vias.

4. The device of claim 3, wherein said plurality of through-substrate vias of said first coupling element are electrically coupled end-to-end and said plurality of through-substrate vias of said second coupling element are electrically coupled end-to-end.

5. The device of claim 3, wherein said first coupling element further comprises an upper conductive layer electrically coupled between a top end of one of said through-substrate vias and a top end of another of said through-substrate vias, said upper conductive layer overlying said substrate.

6. The device of claim 3, wherein said second coupling element further comprises an upper conductive layer electrically coupled between a top end of one of said through-substrate vias and a top end of another of said through-substrate vias, said upper conductive layer overlying said substrate.

7. The device of claim 3, wherein said first coupling element further comprises a lower conductive layer electrically coupled between a bottom end of one of said through-substrate vias and a bottom end of another of said through-substrate vias, said lower conductive layer underlying said substrate.

8. The device of claim 3, wherein said second coupling element further comprises a lower conductive layer electrically coupled between a bottom end of one of said through-substrate vias and a bottom end of another of said through-substrate vias, said lower conductive layer underlying said substrate.

9. The device of claim 1, wherein said first coupling element is a primary coupling element and a said second coupling element is a secondary coupling element.

10. The device of claim 1, wherein said radio frequency coupler further comprises a third coupling element spacedly disposed from said first coupling element and spacedly disposed from said second coupling element, said third coupling element including at least one through-substrate via disposed in said substrate.

11. The device of claim 1, wherein said at least one through-substrate via of said first coupling element comprises a metallic material and said at least one through-substrate via of said second coupling element comprises a metallic material.

12. A radio frequency coupler, comprising:

a first coupling element, said first coupling element comprising at least one through-substrate via disposed in a semiconductor substrate; and a second coupling element spacedly disposed from said first coupling element, said second coupling element comprising at least one through-substrate via disposed in said semiconductor substrate.

13. The coupler of claim 12, wherein said first coupling element is electromagnetically coupled to said second coupling element.

14. The coupler of claim 12, wherein said at least one through-substrate via of said first coupling element is a plurality of electrically coupled through-substrate vias and said at least one through-substrate via of said second coupling element is a plurality of electrically coupled through-substrate vias.

15. The coupler of claim 14, wherein said plurality of through-substrate vias of said first coupling element are electrically coupled end-to-end and said plurality of through-substrate vias of said second coupling element are electrically coupled end-to-end.

16. The coupler of claim 12, wherein said at least one through-substrate via of said first coupling element comprises a metallic material and said at least one through-substrate via of said second coupling element comprises a metallic material.

17. A semiconductor device, comprising:

a substrate; and a radio frequency coupler including a first coupling element and a second coupling element electromagnetically coupled to said first coupling element, said first coupling element including at least one conductive via passing through said substrate, said secondary coupling element including at least one conductive via passing through said substrate.

18. The device of claim 17, wherein said first coupling element is spacedly disposed from said second coupling element.

19. The device of claim 17, wherein said at least one conductive via of said first coupling element is a plurality of electrically coupled conductive vias and said at least one conductive via of said second coupling element is a plurality of electrically coupled conductive vias.

20. The device of claim 19, wherein said first conductive vias are electrically coupled end-to-end and said second conductive vias are electrically coupled end-to-end.

21. The device of claim 17, wherein said at least one conductive via of said first coupling element comprises a metallic material and said at least one conductive via of said second coupling element comprises a metallic material.

22. A radio frequency coupler, comprising:

a first coupling element, said first coupling element comprising at least one conductive via passing through a semiconductor substrate; and a second coupling element electromagnetically coupled to said first coupling element, said second coupling element comprising at least one conductive via passing through said semiconductor substrate.

23. The coupler of claim 22, wherein said first coupling element is spacedly disposed from said second coupling element.

24. The coupler of claim 22, wherein said at least one conductive via of said first coupling element is a plurality of electrically coupled conductive vias and said at least one conductive via of said second coupling element is a plurality of electrically coupled conductive vias.

25. The coupler of claim 24, wherein said plurality of conductive vias of said first coupling element are electrically coupled end-to-end and said plurality of conductive vias of said second coupling element are electrically coupled end-to-end.

26. The coupler of claim 22, wherein said at least one first conductive via comprise a metallic material and said at least one second conductive via comprise a metallic material.

27. A semiconductor device, comprising:

a substrate; and a radio frequency coupler, said coupler comprising at least one through-substrate via disposed through said substrate.

28. The device of claim 27, wherein said at least one through-substrate via is a plurality of electrically coupled through-substrate vias.

29. The device of claim 1, wherein said substrate is a semiconductor substrate.

30. The device of claim 1, wherein said substrate is a silicon substrate.

31. The device of claim 12, wherein said semiconductor substrate is a silicon substrate.

32. The device of claim 17, wherein said substrate is a semiconductor substrate.

33. The device of claim 17, wherein said substrate is a silicon substrate.

34. The device of claim 22, wherein said semiconductor substrate is a silicon substrate.

35. The device of claim 27, wherein said substrate is a semiconductor substrate.

36. The device of claim 27, wherein said substrate is a silicon substrate.

* * * * *